(12) United States Patent
Eemani et al.

(10) Patent No.: US 11,508,416 B2
(45) Date of Patent: Nov. 22, 2022

(54) MANAGEMENT OF THERMAL THROTTLING IN DATA STORAGE DEVICES

(71) Applicant: Western Digital Technologies, Inc., San Jose, CA (US)

(72) Inventors: Kiran Kumar Eemani, Bangalore (IN); Sridhar Prudvi Raj Gunda, Bangalore (IN); Shivam Chawla, Rohtak (IN)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/203,533

(22) Filed: Mar. 16, 2021

(65) Prior Publication Data

US 2022/0301598 A1 Sep. 22, 2022

(51) Int. Cl.
*G11C 5/14* (2006.01)
*G06F 11/30* (2006.01)

(52) U.S. Cl.
CPC ............ *G11C 5/14* (2013.01); *G06F 11/3037* (2013.01); *G06F 11/3062* (2013.01)

(58) Field of Classification Search
CPC ..... G11C 5/14; G06F 11/3037; G06F 11/3062
See application file for complete search history.

(56) References Cited

U.S. PATENT DOCUMENTS

| | | | |
|---|---|---|---|
| 9,760,311 B1 | 9/2017 | Amir et al. | |
| 10,013,194 B1 | 7/2018 | Yang et al. | |
| 11,061,619 B1 * | 7/2021 | Benisty | G06F 3/0625 |
| 2016/0320971 A1 | 11/2016 | Postavilsky et al. | |
| 2018/0284857 A1 | 10/2018 | Yang et al. | |
| 2020/0050246 A1 | 2/2020 | Karalnik et al. | |
| 2020/0104067 A1 | 4/2020 | Shaharabany et al. | |
| 2022/0066899 A1 * | 3/2022 | Sloat | G06F 11/0772 |
| 2022/0100258 A1 * | 3/2022 | Lin | G06F 1/3287 |

* cited by examiner

*Primary Examiner* — Ajay Ojha
(74) *Attorney, Agent, or Firm* — Loza & Loza, LLP; Gabriel Fitch

(57) ABSTRACT

Methods and apparatus for management of thermal throttling in data storage devices are provided. One such data storage device includes a non-volatile memory (NVM), an always-on (AON) memory, and a processor coupled to the NVM and AON memory. The processor is configured to: receive an indication that a temperature of the data storage device exceeds a first temperature threshold, while the data storage device is in a powered-on state; store, responsive to the indication, status information of the data storage device in the AON memory; cause, responsive to the indication and the stored status information, the data storage device to enter a low power state wherein the only component of the data storage device that remains on is the AON memory; and restore, responsive to the data storage device resuming the powered-on state, the status information to the data storage device from the AON memory.

19 Claims, 9 Drawing Sheets

| Module | Full Performance | DPS3.Hot | GSD/UGSD |
|---|---|---|---|
| AON | On | On | Off |
| NAND Core | On | Off | Off |
| NAND IF | On | Off | Off |
| Core Logic | On | Off | Off |
| FIM PHY | On | Off | Off |
| MRAM/ARAM/TRAM/ADP/XOR | On | Off (TRAM & ADP is under retention) | Off |
| BRAM | On | Off | Off |
| DCCM RAMS | On | Off | Off |
| PCIe Link Level | L0 | L1.2 | Off |

FIG. 6

| Location | Size |
|---|---|
| HIM (FE) | 37K |
| PCU Code Data | 17K |
| Set Configuration Saved Data (prestart setup) | 1K |
| File System (Boot Page and directory) | 4K |
| FTL Saved Data | 1K |
| PS Saved Data | 1K |
| Security Saved Data | 3K |
| Total | 64K |

700

MANAGEMENT OF THERMAL THROTTLING IN DATA STORAGE DEVICES

FIELD

The subject matter described herein relates to data storage devices and controllers. More particularly, the subject matter relates, in some examples, to the management of thermal throttling in data storage devices.

INTRODUCTION

Data storage devices, such as solid-state devices (SSDs), may generate a significant amount of heat during operation. In the case of SSDs, for example, a controller of an SSD may be instructed (e.g., by a host device) to execute a series of memory operations (e.g., read, write, etc.) with respect to one or more non-volatile memory devices (e.g., NAND Flash memory devices). Rapid execution of these memory operations to meet the performance demands of the host may cause excess heat to build up in the SSD. Such excess heat may raise the temperature of the SSD to a critical temperature (e.g., a temperature at which the SSD shuts off to prevent damage to the components of the SSD), thereby negatively impacting SSD performance.

Thermal throttling allows SSD operation within a temperature constraint while attempting to maximizing performance. High performance consumes high power, which in turn dissipates heat that can cause the system to reach a thermal constraint of a certain temperature, where the SSD may be powered off. These high temperature events can occur quickly and thereby cause an unplanned or ungraceful shutdown of the SSD. Recovery from an ungraceful shutdown decreases SSD performance (e.g., for attending to host requests/commands) and increases mount time (e.g., as compared to a graceful shutdown or avoiding shutdown all together), which is the time during which the SSD is powering up but not yet functional. The recovery also may involve additional log writes (e.g., writing of SSD system information to the NVM) which may increase write amplification during log synchronization at mount time. Therefore, improved techniques for mitigating temperature increases and thermal shutdowns in SSDs are needed.

SUMMARY

The following presents a simplified summary of some aspects of the disclosure to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present various concepts of some aspects of the disclosure in a simplified form as a prelude to the more detailed description that is presented later.

One aspect of the disclosure provides a data storage device, comprising: a non-volatile memory (NVM); an always-on (AON) memory; and a processor coupled to the NVM and AON memory, the processor configured to: receive an indication that a temperature of the data storage device exceeds a first temperature threshold, while the data storage device is in a powered-on state; store, responsive to the indication, status information of the data storage device in the AON memory; cause, responsive to the indication and the stored status information, the data storage device to enter a low power state wherein the only component of the data storage device that remains on is the AON memory; and restore, responsive to the data storage device resuming the powered-on state, the status information to the data storage device from the AON memory.

One aspect of the disclosure provides a method for use with a data storage device including a non-volatile memory (NVM) and an always-on (AON) memory, the method comprising: receiving an indication that a temperature of the data storage device exceeds a first temperature threshold, while the data storage device is in a powered-on state; storing, responsive to the indication, status information of the data storage device in the AON memory; reducing, responsive to the indication and the stored status information, a power usage of the data storage device to a low power state such that the only component of the data storage device that remains on is the AON memory; and restoring, responsive to the data storage device resuming the powered-on state, the status information to the data storage device from the AON memory.

One aspect of the disclosure provides a data storage device comprising: a non-volatile memory (NVM); an always-on (AON) memory; means for receiving an indication that a temperature of the data storage device exceeds a temperature threshold, while the data storage device is in a powered-on state; means for storing, responsive to the indication, status information of the data storage device in the AON memory; means for reducing, responsive to the indication and the stored status information, a power usage of the data storage device such that the only component of the data storage device that remains on is the AON memory; and means for restoring, responsive to the data storage device resuming the powered-on state, the status information to the data storage device from the AON memory.

BRIEF DESCRIPTION OF THE DRAWINGS

FIG. 6 is a table illustrating various modules/components of an SSD and the corresponding power use in various power states/modes in accordance with some aspects of the disclosure.

DETAILED DESCRIPTION

Figure 1:
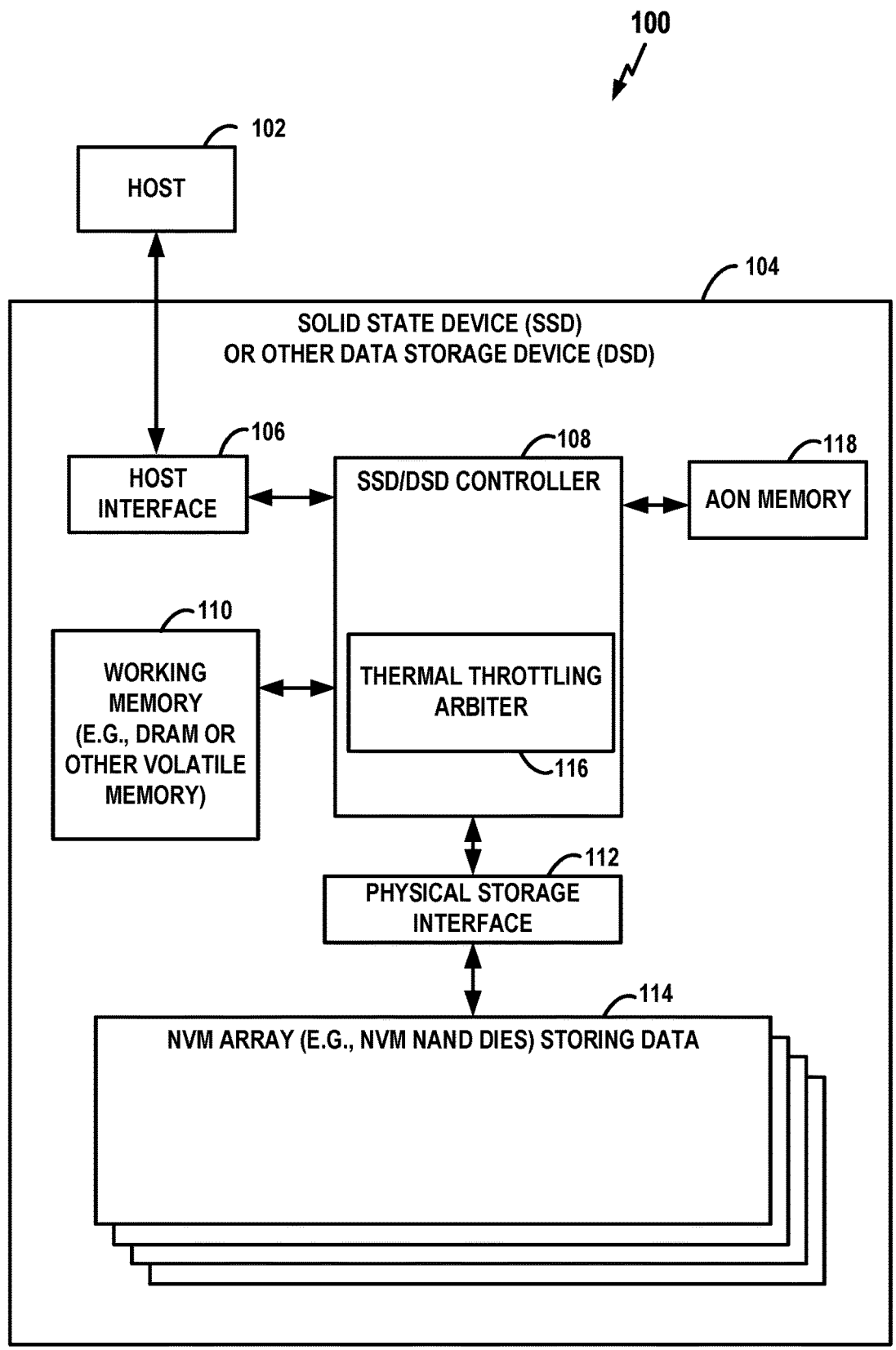
FIG. 1 is a schematic block diagram illustrating an exemplary data storage device (DSD) embodied as a solid-state device (SSD) including an always-on (AON) memory and a SSD controller configured to manage thermal shutdown using a low power state in accordance with some aspects of the disclosure.

In the following detailed description, reference is made to the accompanying drawings, which form a part thereof. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

The examples herein relate to data storage devices (DSDs) and to data storage controllers of the DSDs. In the main examples described herein, data is stored within non-volatile memory (NVM) arrays. In other examples, data may be stored in hard disk drives (HDD). DSDs with NVM arrays may be referred to as solid state devices (SSDs). Some SSDs use NAND flash memory, herein referred to as "NANDs." A NAND is a type of non-volatile storage technology that does not require power to retain data. It exploits negative-AND, i.e., NAND, logic. For the sake of brevity, an SSD having one or more NAND dies will be used as a non-limiting example of a DSD below in the description of various embodiments. It is understood that at least some aspects described herein may be applicable to other forms of DSDs as well. For example, at least some aspects described herein may be applicable to phase-change memory (PCM) arrays, magneto-resistive random access memory (MRAM) arrays, and resistive random access memory (ReRAM) arrays.

OVERVIEW

Aspects of the disclosure relate to improved techniques to manage thermal throttling, and in particular thermal shutdown. One particular aspect involves a data storage device such as an SSD that includes a non-volatile memory (NVM), an always-on (AON) memory, and a controller or processor coupled to the NVM and AON memory. In such case, the processor is configured to receive an indication that a temperature of the SSD (e.g., measured at a NAND array in the NVM) exceeds a first temperature threshold, while the SSD is in a powered-on state; store, responsive to the indication, status information of the SSD in the AON memory; cause, responsive to the indication and the stored status information, the SSD to enter a low power state wherein the only component of the data storage device that remains on is the AON memory; and restore, responsive to the data storage device resuming the powered-on state, the status information to the data storage device from the AON memory. In one aspect, the processor is also configured to determine whether the temperature of the SSD (e.g., or NAND within NVM) still exceeds the temperature threshold after a preselected period after the indication. If so, the processor is configured to proceed with storing the status information and causing the SSD to enter the low power state. If not, the processor is configured to not store status information and the SSD remains in the powered-on state without entering the low power state.

Several advantages are provided by these improved techniques for thermal management. For example, by storing status information in the AON memory, rather than in NVM, the recovery time for the SSD is drastically reduced (e.g., by some 5 to 8 seconds of time usually needed if writing status information to NVM before shutdown) and write amplification is reduced (e.g., by avoiding writing to the NVM during mount to update mapping tables due to information loss during an ungraceful shutdown). In addition, by entering the low power state (e.g., that consumes a very small amount of power), the temperature of the SSD drops very quickly, and power consumption is reduced.

Exemplary Devices, Systems and Procedures

FIG. 1 is a schematic block diagram illustrating an exemplary data storage device (DSD) embodied as a solid-state device (SSD) including an always-on (AON) memory and an SSD controller configured to manage thermal shutdown using a low power state in accordance with some aspects of the disclosure. The system 100 includes a host 102 and the SSD 104 (or other DSD, but for simplicity referred to as an SSD below) coupled to the host 102. The host 102 provides commands to the SSD 104 for transferring data between the host 102 and the SSD 104. For example, the host 102 may provide a write command to the SSD 104 for writing data to the SSD 104 or read command to the SSD 104 for reading data from the SSD 104. The host 102 may be any system or device having a need for data storage or retrieval and a compatible interface for communicating with the SSD 104. For example, the host 102 may be a computing device, a personal computer, a portable computer, a workstation, a server, a personal digital assistant, a digital camera, or a digital phone as merely a few examples.

The SSD 104 includes a host interface 106, an SSD or DSD controller 108, a working memory 110 (such as DRAM or other volatile memory), a physical storage (PS) interface 112 (e.g., flash interface module (FIM)), and an NVM array 114 having one or more dies storing data. The host interface 106 is coupled to the controller 108 and facilitates communication between the host 102 and the controller 108. The controller 108 is coupled to the working memory 110 as well as to the NVM array 114 via the PS interface 112. The host interface 106 may be any suitable communication interface, such as a Non-Volatile Memory express (NVMe) interface, a Universal Serial Bus (USB) interface, a Serial Peripheral (SP) interface, an Advanced Technology Attachment (ATA) or Serial Advanced Technology Attachment (SATA) interface, a Small Computer System Interface (SCSI), an IEEE 1394 (Firewire) interface, or the like. In some embodiments, the host 102 includes the SSD 104. In other embodiments, the SSD 104 is remote from the host 102 or is contained in a remote computing system communicatively coupled with the host 102. For example, the host 102 may communicate with the SSD 104 through a wireless communication link. The NVM array 114 may include multiple dies.

In some examples, the host 102 may be a laptop computer with an internal SSD and a user of the laptop may wish to playback video stored by the SSD. In another example, the host again may be a laptop computer, but the video is stored by a remote server.

Although, in the example illustrated in FIG. 1, SSD 104 includes a single channel between controller 108 and NVM array 114 via PS interface 112, the subject matter described herein is not limited to having a single memory channel. For example, in some NAND memory system architectures, two, four, eight or more NAND channels couple the controller and the NAND memory device, depending on controller capabilities. In any of the embodiments described herein, more than a single channel may be used between the controller and the memory die, even if a single channel is shown in the drawings. The controller 108 may be implemented in a single integrated circuit chip and may communicate with different layers of memory in the NVM 114 over one or more command channels.

The controller 108 controls operation of the SSD 104. In various aspects, the controller 108 receives commands from the host 102 through the host interface 106 and performs the commands to transfer data between the host 102 and the NVM array 114. Furthermore, the controller 108 may manage reading from and writing to working memory 110 for performing the various functions effected by the controller and to maintain and manage cached information stored in the working memory 110.

The controller 108 may include any type of processing device, such as a microprocessor, a microcontroller, an embedded controller, a logic circuit, software, firmware, or the like, for controlling operation of the SSD 104. In some aspects, some or all of the functions described herein as being performed by the controller 108 may instead be performed by another element of the SSD 104. For example, the SSD 104 may include a microprocessor, a microcontroller, an embedded controller, a logic circuit, software, firmware, application specific integrated circuit (ASIC), or any kind of processing device, for performing one or more of the functions described herein as being performed by the controller 108. According to other aspects, one or more of the functions described herein as being performed by the controller 108 are instead performed by the host 102. In still further aspects, some or all of the functions described herein as being performed by the controller 108 may instead be performed by another element such as a controller in a hybrid drive including both non-volatile memory elements and magnetic storage elements. The SSD controller 108 includes a thermal throttling arbiter 116, which can be configured to perform thermal shutdown management as will be described in further detail below. In one aspect, the thermal throttling arbiter 116 can store SSD status information in an AON memory 118 after receiving an indication of an SSD temperature being greater than a threshold and enter a low power state. In one aspect, the thermal throttling arbiter 116 is a module within the SSD controller 108 that is controlled by firmware. In one aspect, the thermal throttling arbiter/controller 116 may be a separate component from the SSD controller 108 and may be implemented using any combination of hardware, software, and firmware (e.g., like the implementation options described above for SSD controller 108) that can perform thermal shutdown management as will be described in further detail below. In one example, the thermal throttling arbiter 116 is implemented using a firmware algorithm or other set of instructions that can be performed on the SSD controller 108 to implement the thermal shutdown management functions described below.

The working memory 110 may be any suitable memory, computing device, or system capable of storing data. For example, working memory 110 may be ordinary RAM, DRAM, double data rate (DDR) RAM, static RAM (SRAM), synchronous dynamic RAM (SDRAM), a flash storage, an erasable programmable read-only-memory (EPROM), an electrically erasable programmable ROM (EEPROM), or the like. In various embodiments, the controller 108 uses the working memory 110, or a portion thereof, to store data during the transfer of data between the host 102 and the NVM array 114. For example, the working memory 110 or a portion of the volatile memory 110 may be a cache memory. The NVM array 114 receives data from the controller 108 via the PS interface 112 and stores the data. In some embodiments, working memory 110 may be replaced by a non-volatile memory such as MRAM, PCM, ReRAM, etc. to serve as a working memory for the overall device.

The NVM array 114 may be implemented using NAND flash memory. In one aspect, the NVM array 114 may be implemented using any combination of NAND flash, PCM arrays, MRAM arrays, and/or ReRAM.

The PS interface 112 provides an interface to the NVM array 114. For example, in the case where the NVM array 114 is implemented using NAND flash memory, the PS interface 112 may be a flash interface module. In one aspect, the PS interface 112 may be implemented as a component of the SSD controller 108.

In the example of FIG. 1, the controller 108 may include hardware, firmware, software, or any combinations thereof that provide the functionality for the thermal management arbiter 116.

Although FIG. 1 shows an exemplary SSD and an SSD is generally used as an illustrative example in the description throughout, the various disclosed embodiments are not necessarily limited to an SSD application/implementation. As an example, the disclosed NVM array and associated processing components can be implemented as part of a package that includes other processing circuitry and/or components. For example, a processor may include, or otherwise be coupled with, embedded NVM array and associated circuitry. The processor could, as one example, off-load certain operations to the NVM and associated circuitry and/or components. As another example, the SSD controller 108 may be a controller in another type of device and still be configured to perform or control thermal shutdown management and/or throttling, and perform some or all of the other functions described herein.

The AON memory 118 may be any suitable memory, computing device, or system capable of storing data with a connection to power that does not get switched off. For example, AON memory 118 may be ordinary RAM, DRAM, double data rate (DDR) RAM, static RAM (SRAM), synchronous dynamic RAM (SDRAM), a flash storage, an erasable programmable read-only-memory (EPROM), an electrically erasable programmable ROM (EEPROM), or the like with a continuous power supply. In one aspect, the AON memory 118 may be a RAM with a continuous power supply (e.g., a connection to power that cannot be switched off unless there is a total loss of power to the SSD, such as during a graceful or ungraceful shutdown). In one aspect, the AON memory 118 will be powered on for all low power modes. In one aspect, the AON memory 118 is a sub-component of the SSD controller. In one aspect, the AON memory 118 is integrated in a sub-component (e.g., a processor such as an AON processor) of the SSD controller.

Thermal Throttling

Figure 2:
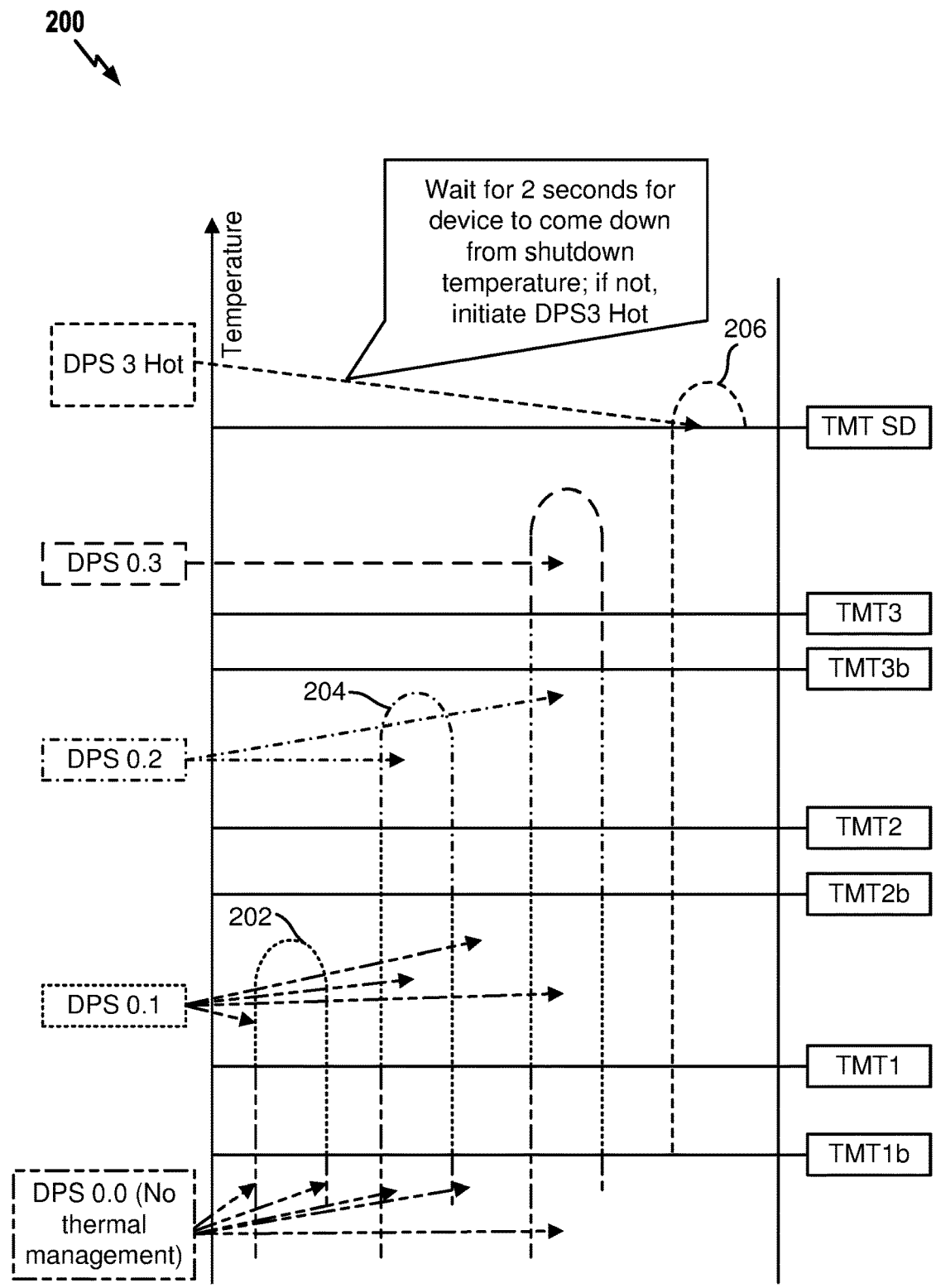
FIG. 2 is a schematic diagram illustrating one method for thermal management involving various temperature thresholds and corresponding SSD power states in accordance with some aspects of the disclosure.

FIG. 2 is a schematic diagram illustrating one method 200 for thermal management involving various temperature thresholds and corresponding SSD power states in accordance with some aspects of the disclosure. This method 200 could be used in conjunction with any of the SSDs described herein, including, for example, the SSD 100 of FIG. 1. The left side of the diagram shows a vertical axis indicating that temperature increases vertically. The diagram shows three possible thermal management sequences.

First, in thermal management sequence 202, the NAND temperature increases over a first temperature threshold (e.g., thermal management temperature 1 or TMT1), and the SSD/NAND subsystem may activate a light throttling and switch the device power state to a first throttled power state (e.g., device power state 0.1 or DPS0.1). This action is intended to cause the SSD and/or NAND cool down. When the temperature drops to a first temperature sub-threshold, TMT1b, the SSD/NAND subsystem may stop the light throttling and switch the device power state to a non-throttled power state, DPS0.0.

Second, in thermal management sequence 204, the NAND temperature increases above a second temperature threshold (e.g., thermal management temperature 2 or TMT2 and after increasing above TMT1), and the SSD/NAND subsystem may activate heavy throttling and switch the device power state to a second throttled power state (e.g., device power state 0.2 or DPS0.2). If the SSD/NAND can be cooled down, the SSD/NAND may switch back to DPS0.1 when reaching TMT2b and then to DPS0.0 when dropping below TMT1b.

Third, in thermal management sequence 206, if for some reason, the NAND temperature cannot be cooled down by throttling and it increases above a fourth temperature threshold (e.g., thermal management temperature shutdown or TMTSD after increasing above TMT3), the SSD/NAND subsystem may allow for two seconds time for the device to come down below the shutdown temperature (TMTSD). If the device temperature does not reduce below shutdown temperature (TMTSD), the device may place itself in an ultra-low power state (e.g., DPS3 Hot or just low power state), wherein the only component that stays powered in the device is an AON memory. The AON memory can store status information of the SSD to enable a graceful shutdown and fast mounting time, among other advantages described above. In one aspect, the AON memory stores status information of the SSD during entry to low power states like DPS0.3 or DPS3 Hot).

In one example, the thermal management thresholds can be as follows: TMT1b=65° C.; TMT1=68° C.; TMT2b=75° C.; TMT2=78° C.; TMT3b=82° C.; TMT3=85° C.; TMTSD=93° C. In other examples, these thresholds can have other suitable values (e.g., dependent on drive characteristics and application). In the above description of the thermal management sequences 202, 204, and 206, actions are taken based on increases in NAND temperature. In one aspect, these actions are taken solely based on increases or decreases in NAND temperature. In one aspect, this is because the temperature thresholds for failure are lowest at the NAND (e.g., 95° C.) as compared to the SSD (e.g., 120° C.) or the AON memory (e.g., 160° C.).

Figure 3:
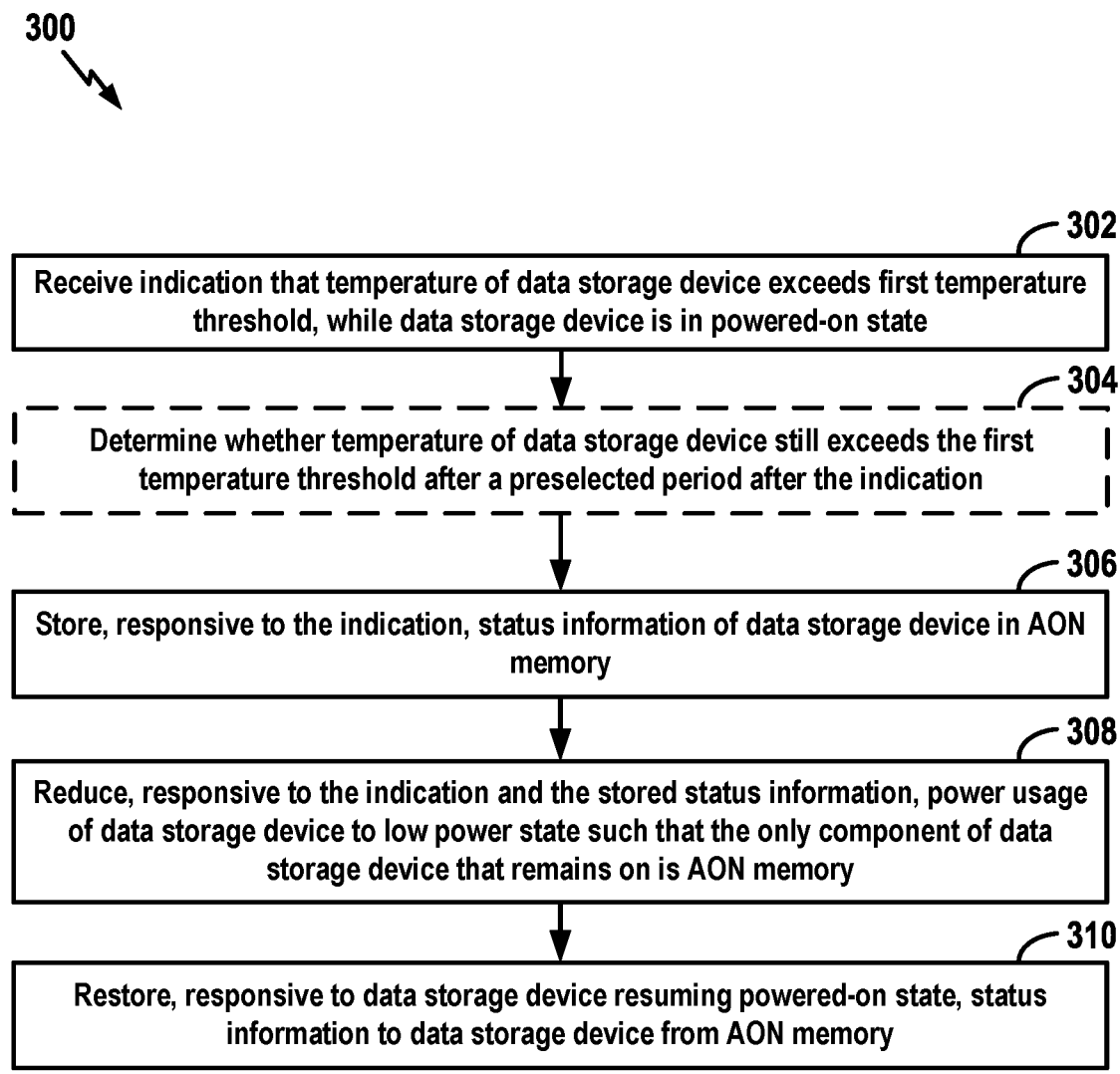
FIG. 3 is a flowchart illustrating a method for thermal shutdown management that may be performed by a controller of an SSD in accordance with some aspects of the disclosure.

FIG. 3 is a flowchart illustrating a method 300 for thermal shutdown management that may be performed by a controller of an SSD in accordance with some aspects of the disclosure. In one aspect, the method/process 300 may be performed by the SSD/DSD controller 108 (or thermal throttling arbiter 116) of FIG. 1, or the NVMe controller 418 (or processor 424) of FIG. 4, or any other suitably equipped device controller.

At block 302, the process receives an indication that a temperature of the data storage device exceeds a first temperature threshold, while the data storage device is in a powered-on state. In one aspect, the indication is provided by a temperature sensor in the DSD or SSD. In one aspect, the temperature sensor is positioned at or near the NVM/NAND (e.g., at NVM 114 in FIG. 1 or at NVM 420 in FIG. 4). In one aspect, the temperature sensor measures an ambient temperature of the SSD, an ambient temperature of the NVM, a workload temperature of the NVM, the temperature at specific NVM dies, or some combination of these temperatures. In one aspect, the first temperature threshold corresponds to a maximum allowed temperature (e.g., maximum temperature specified by the manufacturer of the NVM/NAND) before a data loss occurs in the NVM based on temperature. In one example, the maximum allowed temperature is 95° C.

At optional block 304, the process may determine whether the temperature of the data storage device exceeds the temperature threshold after a preselected period after the indication. If so, the process may proceed to block 306. If not, the process may stop at block 304, effectively allowing the DSD/SSD to return to normal operation without attempting to enter an ultra-low power state. In such case, the process may operate, responsive to the determination that the temperature of the data storage device does not exceed the temperature threshold for the preselected period, without causing the data storage device to enter the low power state. In one aspect, the preselected period is 2 seconds. In one aspect, the preselected period is 2-3 seconds. In another aspect, the preselected period can be another duration suitable for the SSD and based on operational or manufacturing parameters.

At block 306, the process stores, responsive to the indication, the status information of the data storage device in the AON memory. If the process performed the determination of block 304 and determined that the temperature of the DSD still exceeds the first temperature, the process stores, responsive to the indication and the determination of block 304, the status information of the data storage device in the AON memory. In one aspect, the status information of the DSD/SSD can include one or more of boot block information, directory information, and/or SSD sub-component context information. This SSD sub-component context information can include context information for different layers of the SSD firmware, such as the flash translation layer (FTL), an infrastructure layer, a physical storage layer, and/or a front-end layer. These layers and sub-components will be described in greater detail below. Boot block information and directory information are important for the initialization of the SSD. More specifically, these are pointers to the locations from where the device can be booted. During initialization time, the SSD needs to find the latest boot page present in the latest boot block which may be time consuming. During DPS3 Hot (e.g., the low power state or ultra-low power state with only the AON memory powered on), the latest boot page (or a pointer thereto) is stored in the AON memory (e.g., boot block information), so the SSD does not need to search for it. Thus, the process 300 reduces the execution time (e.g., mounting time) for the firmware.

At block 308, the process reduces, responsive to the indication and the stored status information, a power usage of the data storage device to a low power state such that the only component of the data storage device that remains on is the AON memory. In one aspect, the process causes the DSD/SSD to enter the low power state.

At block 310, the process restores, responsive to the data storage device resuming the powered-on state (e.g., after it has been cooled in the low power state), the status information to the data storage device from the AON memory. Once this is done, the SSD mounting process may complete rapidly.

In one aspect, the process may also receive a second indication that a temperature of the data storage device exceeds a second temperature threshold that is less than the first temperature threshold, while the data storage device is in the powered-on state. In such case, the process may activate, responsive to the second indication, a thermal throttling and thereby cause the data storage device to enter a power state that consumes less power than the powered-on state. Examples of these other throttled power states are shown in FIG. 2.

In one aspect, the AON memory is configured to operate at a temperature greater than the first temperature threshold.

In one aspect, the process may also receive commands (e.g., read and write commands) from a host device, and execute the commands using the NVM.

Figure 4:
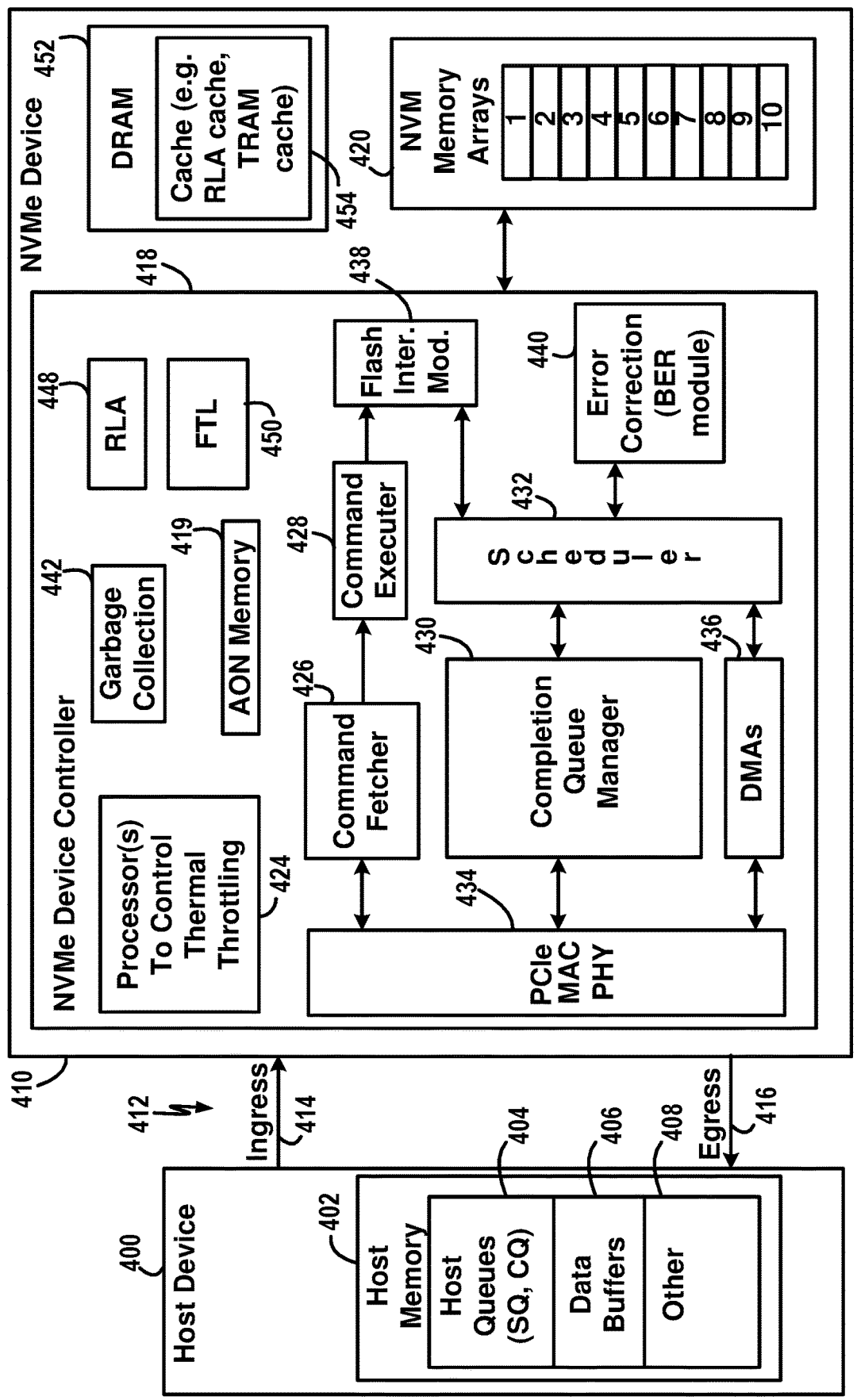
FIG. 4 is a schematic block diagram illustrating an exemplary data storage system with a Non-Volatile Memory express (NVMe) device controller including an AON memory, the controller configured to perform thermal shutdown management in accordance with some aspects of the disclosure.

FIG. 4 is a schematic block diagram illustrating an exemplary data storage system with a Non-Volatile Memory express (NVMe) device controller 418 including an AON memory 419, the controller configured to perform thermal shutdown management in accordance with some aspects of the disclosure. The system includes a host device 400 that may be any suitable computing or processing platform capable of accessing memory on an NVM data storage device to write data using NVMe procedures. The host device 400 includes internal memory 402, which in this example is dynamic random-access memory (DRAM). The host memory 402 may be configured to include, as shown, various host submission queues (SQs) and completion queues (CQs) 404, data buffers 406 and other memory components 408. The host device 400 may store data in an NVMe storage device 410. The NVMe device 410 may be any suitable device that provides non-volatile memory storage for host device 400 in accordance with NVMe standards. For example, the NVMe device 410 may be a removable storage device, such as a flash SSD that is removably connectable to host device 400. In another example, the NVMe device 410 may be non-removable or integrated within the host device 400. In some embodiments, the host device 400 and the NVMe device 410 are communicatively connected via a PCIe bus 412 (including ingress 414 and egress 416).

The NVMe storage device 410 of FIG. 4 includes an NVMe controller 418 and a non-volatile memory 420. The NVMe controller 418 controls access to the non-volatile memory 420 such as a NAND. The NVMe controller 418 thus may be a non-volatile memory controller that implements or supports the NVMe protocol, and the non-volatile memory 420 may implemented with two dimensional (2D) or three dimensional (3D) NAND flash memory. The NVMe controller includes one or more processors 424 configured to control thermal throttling, including thermal shutdown and recovery. The processor(s) 424 are also responsible for the execution of other frond-end and back-end tasks.

In operation, a command fetcher 426 of the NVMe controller 418 fetches commands, such as read requests for data, from the submission queues within the host memory 402 and forwards the commands to a command executer 428. The command fetcher 426 is responsible for fetching and parsing the commands from the host and queuing them internally, and may form part of a front end of the NVMe controller 418. The command executer 428 is responsible for arbitrating and executing the commands. Upon completion of the commands, the NVMe controller 418 generates completion entries that are ultimately directed to the completion queues within the host memory 402. A completion queue manager 430 is responsible for managing the host completion queues. Among other functions, the completion queue manager 430 routes completion entries received from a scheduler 432 to a completion queue within the host device 400 via a PCIe MAC PHY interface 434.

Actual streams of data (obtained as the result of read commands applied to the NVM memory arrays 420) are delivered to the host device 400 using one or more DMAs 436. Additional components of the NVMe controller 418 shown in FIG. 4 include a flash interface module (FIM) 438, which is responsible for controlling and accessing the memory arrays 420, and an error correction code (ECC) component 440, which includes a bit error rate (BER) module.

Additional components of the NVMe controller 418 include: a garbage collection module 442 for controlling garbage collection and related tasks; a read look ahead (RLA) controller 448; and an FTL 450. Note that some of these components may be part of the flash interface module 438 but are shown separately for the sake of completeness and convenience. The NVMe storage device 410 may additionally include a DRAM 452 (or other working memory), which may include a cache 454.

In one aspect, the thermal throttling processor 424 can perform one or more of the actions of process 300 in FIG. 3, or act as the thermal throttling arbiter 116 of FIG. 1. For example, in one aspect, the thermal throttling processor 424 can store SSD status information in an AON memory 419 after receiving an indication of an SSD temperature being greater than a threshold and enter a low power state. In one aspect, the thermal throttling processor 424 can be implemented as a single processor. In another aspect, the thermal throttling processor 424 can be implemented with a main processor and a secondary processor (e.g., a physical storage or PS processor). The main processor can be directed to performing the general functions of the controller 418, while the PS processor can be directed to performing the functions (e.g., reads and writes) related to communication with the memory arrays 420.

In one aspect, NAND memory arrays 420 can include a temperature sensor disposed to measure an ambient temperature at the NAND arrays 420, or at particular NAND arrays. In one aspect, the temperature sensor can be disposed within the controller 418. In one aspect, one temperature sensor can be disposed at the NVM 420 and one can be disposed at, or within, the controller 418.

In one aspect, the host 400 or the NVMe device 410 includes or acts as a resource server that allocates certain units of power for the device. The techniques described herein for saving power can help the device 410 comply with the power allocations set forth by the resource server.

Figure 5:
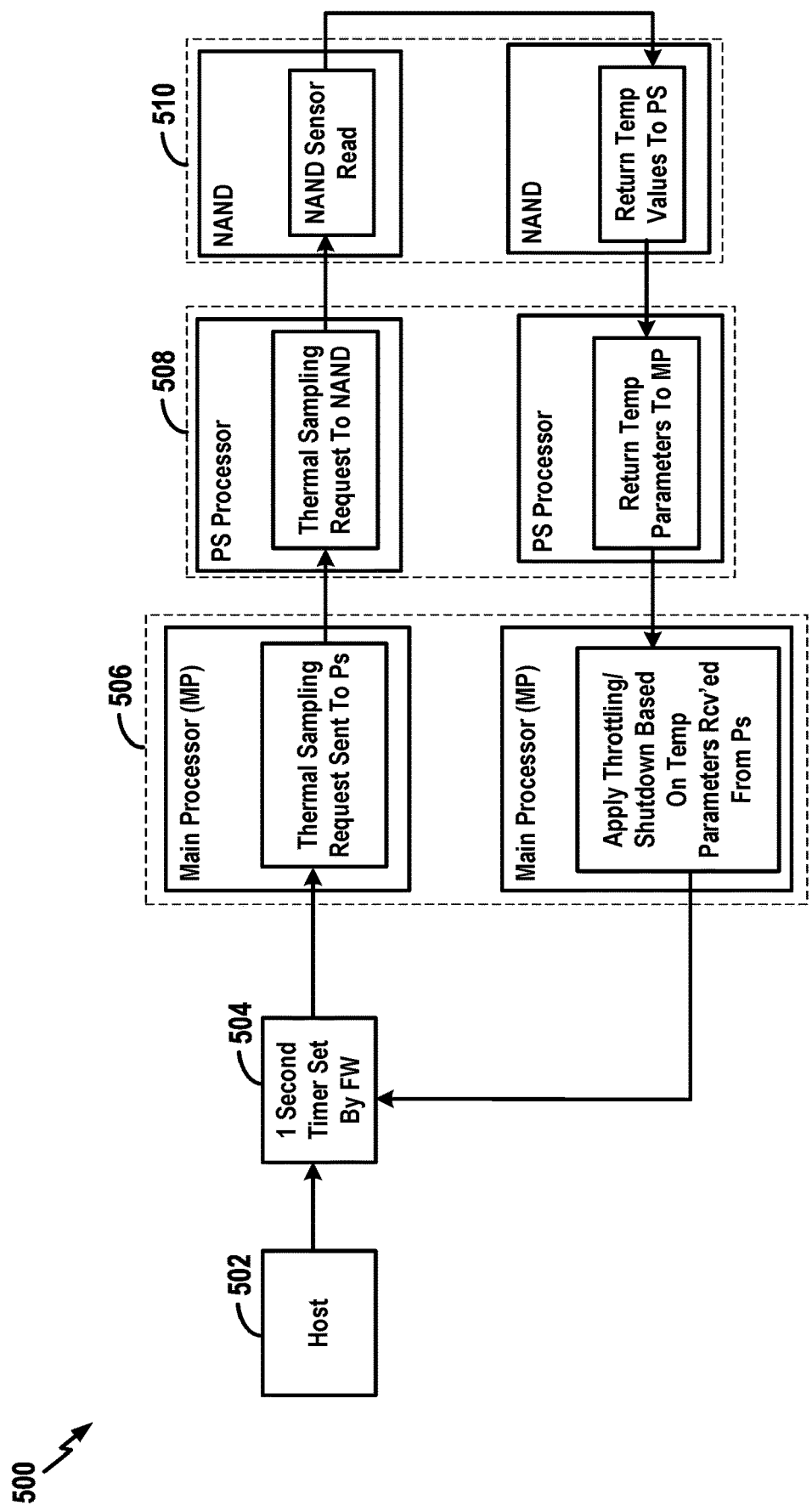
FIG. 5 is a schematic block diagram illustrating an exemplary operational flow in a data storage system configured to perform thermal shutdown management in accordance with some aspects of the disclosure.

FIG. 5 is a schematic block diagram illustrating an exemplary operational flow in a data storage system 500 configured to perform thermal shutdown management in accordance with some aspects of the disclosure. The system includes a host 502, a timer 504, a main processor 506, a physical storage or PS processor 508, and a NAND 510. In one aspect, the system can operate in the manner that follows. First, the host 502 can provide a temperature threshold to the main processor 506 to be used as the reference temperature to decide whether to enter a low power mode. In another aspect, the main processor 506 or SSD including the main processor 506 can be preconfigured with the temperature threshold.

Second, a timer 504 may be set (e.g., by firmware (FW)) for a preselected duration (e.g., 1 second or another suitable duration), during which the set of actions illustrated in FIG. 4 may be performed. The main processor 506 can then send a thermal sampling request to the PS processor 508. The PS processor 508 can then send the thermal sampling request to the NAND 510, or a sensor within the NAND 510. The NAND 510 can respond by returning one or more temperature values to the PS processor 508, and the PS processor 508 can send those to the main processor 506. The main processor 506 can compare the returned/current temperature value to the shutdown temperature threshold and take appropriate action (e.g., actions as described for example in FIG. 3 and the corresponding description of that figure above). These actions may be repeated by the FW for the preselected duration.

FIG. 6 is a table 600 illustrating various modules/components 602 of an SSD and the corresponding power use in various power states/modes in accordance with some aspects of the disclosure. The power states include a full performance power state 604, a DPS3.Hot (e.g., ultra-low power state) 606, and a graceful or ungraceful shutdown power state 608. Among other things, the table 600 illustrates that in the ultra-low power state (DPS3.Hot), each module of the SSD is powered off except the AON, and the PCIe link level is in a low power mode (L1.2). Each of the modules shown in the table corresponds to one or more components of the SSD (see FIG. 4 for the various SSD components), except the PCIe link level, which merely refers to the state of the PCIe link.

Figure 7:
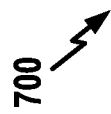
FIG. 7 is a table illustrating an example list of status information components and corresponding size that could be stored in an AON memory in accordance with some aspects of the disclosure.

FIG. 7 is a table 700 illustrating an example list of status information components and corresponding size that could be stored in an AON memory in accordance with some aspects of the disclosure. The example size of the information stored in the AON memory here is 64 kilobytes (KB). In such case, the AON memory need only be 64 KB. In other examples, the information could take more or less space, and the AON memory could be sized accordingly. The boot block information and directory information are contained within the file system information and have a size of 4 KB. The context information for the processor or controller can include the remainder of the status information, including for example, the flash translation layer (FTL) saved data, the physical storage (PS) saved data, security saved data, etc.

In the following, various general exemplary procedures and systems are described.

Additional Exemplary Apparatus

Figure 8:
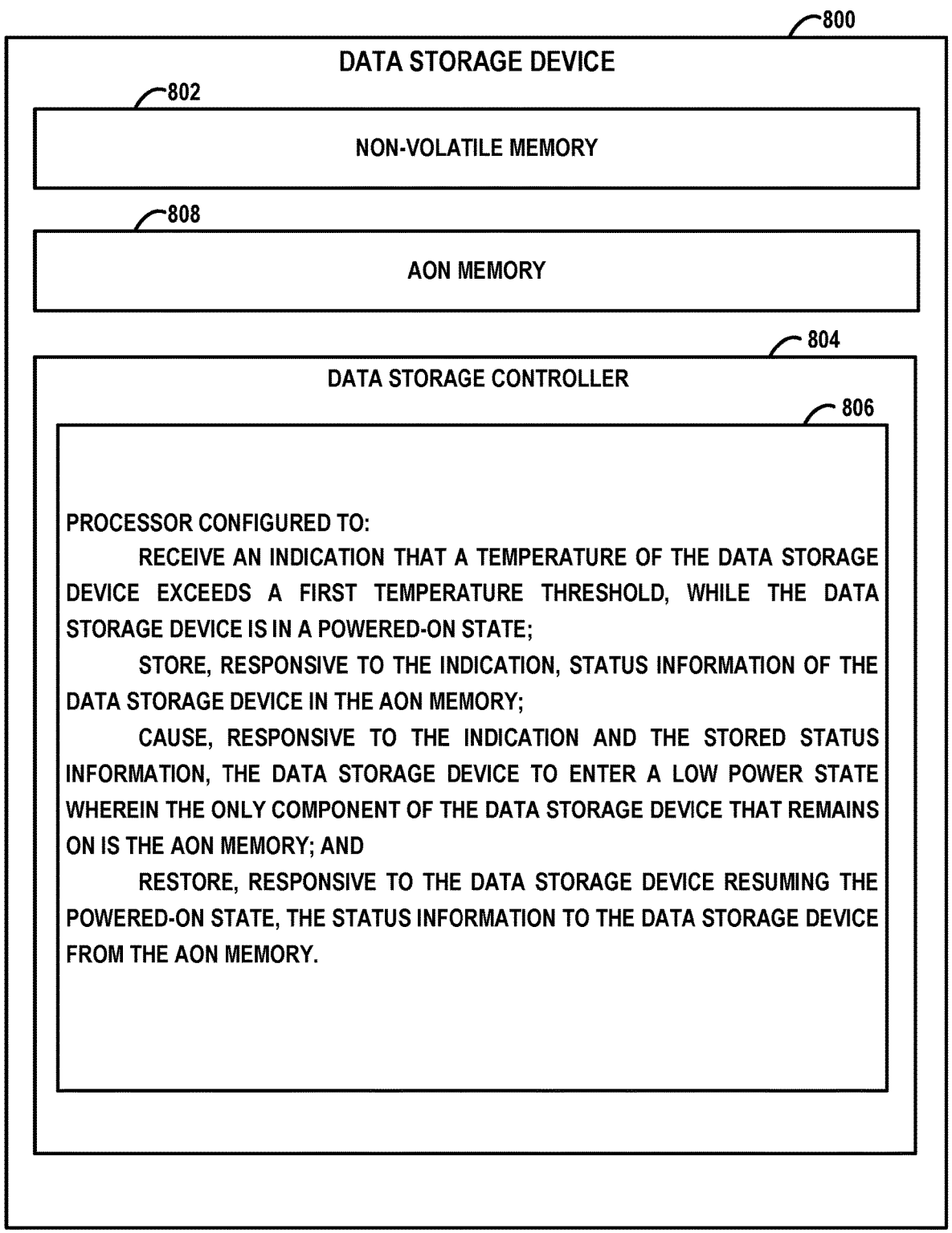
FIG. 8 is a schematic block diagram illustrating an exemplary data storage device configured in accordance with some aspects of the disclosure.

FIG. 8 broadly illustrates a data storage device 800 configured according to one or more aspects of the disclosure. The data storage device 800 includes a non-volatile memory (NVM) 802, an AON memory 808, and a data storage controller 804. The data storage controller 804 includes a processor or processing circuit 806 configured to: receive an indication that a temperature of the data storage device 800 exceeds a first temperature threshold, while the data storage device 800 is in a powered-on state; store, responsive to the indication, status information of the data storage device 800 in the AON memory 808; cause, responsive to the indication and the stored status information, the data storage device 800 to enter a low power state wherein the only component of the data storage device that remains on is the AON memory 808; and restore, responsive to the data storage 800 device resuming the powered-on state, the status information to the data storage device from the AON memory 808.

The processor 806 may also be configured to determine whether the temperature of the data storage device exceeds the temperature threshold after a preselected period after the indication, and store, responsive to the indication and the determination that the temperature of the data storage device still exceeds the temperature threshold after the preselected period, the status information of the data storage device in the AON memory.

The processor 806 may also be configured to operate, responsive to the determination that the temperature of the data storage device does not exceed the temperature threshold for the preselected period, without causing the data storage device to enter the low power state.

In one aspect, the preselected period is in a range from about 2 seconds to about 3 seconds. In one aspect, the status information comprises at least one of boot block information, directory information, or context information for the processor.

The processor 806 may also be configured to receive a second indication that a temperature of the data storage device exceeds a second temperature threshold that is less than the first temperature threshold, while the data storage device is in the powered-on state, and activate, responsive to the second indication, a thermal throttling and thereby cause the data storage device to enter a power state that consumes less power than the powered-on state.

In one aspect, the first temperature threshold corresponds to a maximum allowed temperature before a data loss occurs in the NVM based on temperature. In one aspect, the data storage device 800 further includes a temperature sensor configured to report the temperature of the data storage device and positioned proximate the NVM 802.

In one aspect, the AON memory is configured to operate at a temperature greater than the first temperature threshold (e.g., AON memory is configured to withstand the highest expected temperature of the data storage device).

The processor 806 may also be configured to receive commands from a host device, and execute the commands using the NVM.

Figure 9:
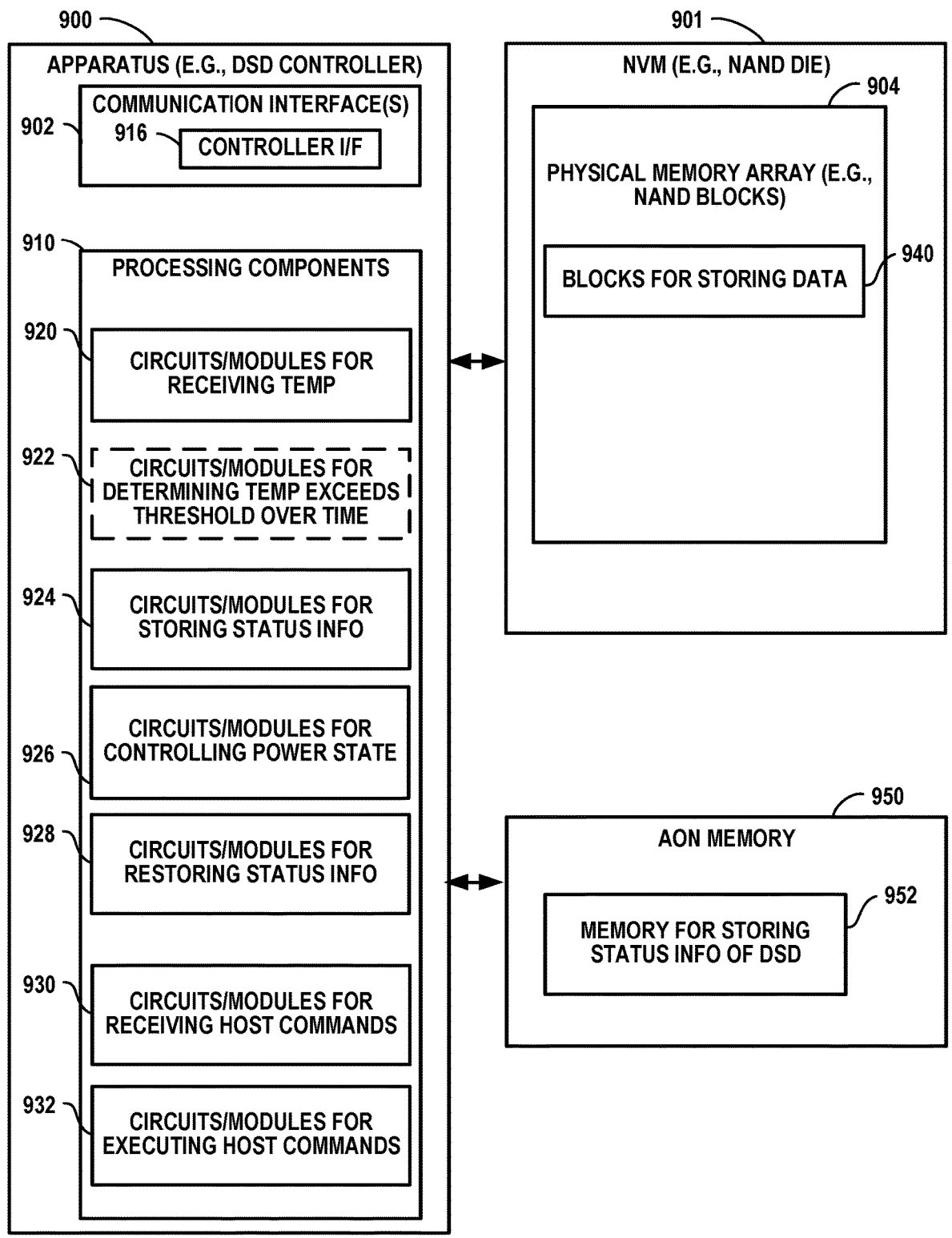
FIG. 9 is a schematic block diagram configuration for an exemplary data storage device configured in accordance with some aspects of the disclosure.

FIG. 9 illustrates an embodiment of an exemplary data storage device 900 configured according to one or more aspects of the disclosure. The apparatus 900, or components thereof, could embody or be implemented within a data storage controller such as a DSD controller coupled to a volatile memory (not shown), an AON memory and a NAND die or some other type of NVM array that supports data storage. In various implementations, the apparatus 900, or components thereof, could be a component of a processor, a controller, a computing device, a personal computer, a portable device, workstation, a server, a personal digital assistant, a digital camera, a digital phone, an entertainment device, a medical device, a self-driving vehicle control device, an edge device, or any other electronic device that stores, processes, or uses data.

The apparatus 900 includes a communication interface 902 and is coupled to a NVM 901 (e.g., a NAND die). The NVM 901 includes physical memory array 904. The communication interface 902 is further coupled to AON memory 950. These components can be coupled to and/or placed in electrical communication with one another via suitable components, represented generally by the connection line in FIG. 9. Although not shown, other circuits such as timing sources, peripherals, voltage regulators, and power management circuits may be provided, which will not be described any further.

The communication interface 902 of the apparatus 900 provides a means for communicating with other apparatuses over a transmission medium. In some implementations, the communication interface 902 includes circuitry and/or programming (e.g., a program) adapted to facilitate the communication of information bi-directionally with respect to one or more devices in a system. In some implementations, the communication interface 902 may be configured for wire-based communication. For example, the communication interface 902 could be a bus interface, a send/receive interface, or some other type of signal interface including circuitry for outputting and/or obtaining signals (e.g., outputting signal from and/or receiving signals into a DSD).

The physical memory array 904 may include one or more NAND blocks 940. The physical memory array 904 may be accessed by the processing components 910.

In one aspect, the apparatus 900 may also include volatile memory for storing instructions and other information to support the operation of the processing components 910.

The apparatus 900 includes various processing components 910 arranged or configured to obtain, process and/or send data, control data access and storage, issue or respond to commands, and control other desired operations. For example, the components 910 may be implemented as one or more processors, one or more controllers, and/or other structures configured to perform functions. According to one or more aspects of the disclosure, the components 910 may be adapted to perform any or all of the features, processes, functions, operations and/or routines described herein. For example, the components 910 may be configured to perform any of the steps, functions, and/or processes described with respect to FIGS. 1-8. As used herein, the term "adapted" in relation to components 910 may refer to the components being one or more of configured, employed, implemented, and/or programmed to perform a particular process, function, operation and/or routine according to various features described herein. The circuits may include a specialized processor, such as an ASIC that serves as a means for (e.g., structure for) carrying out any one of the operations described, e.g., in conjunction with FIGS. 1-8. The components 910 serve as an example of a means for processing. In various implementations, the components 910 may provide and/or incorporate, at least in part, functionality described above for the components of controller 108 of FIG. 1 or controller 418 of FIG. 4.

According to at least one example of the apparatus 900, the processing components 910 may include one or more of: circuit/modules 920 configured for receiving temperature; circuits/modules 922 configured for determining whether temperature exceeds a threshold (over time); circuits/modules 924 configured for storing status information of the DSD controller (e.g., in the AON memory 950/952); circuits/modules 926 configured for controlling power state of the DSD; circuits/modules 928 configured for restoring status information, from the AON memory, to the DSD controller; circuits/modules 930 configured for receiving host commands; and circuits/modules 932 configured for executing host commands.

The physical memory array 904 may include blocks 940 for storing data.

In at least some examples, means may be provided for performing the functions illustrated in FIG. 9 and/or other functions illustrated or described herein. For example, the means may include one or more of: means, such as circuit/module 920, for receiving an indication that a temperature of the data storage device exceeds a temperature threshold, while the data storage device is in a powered-on state; means, such as circuit/module 924, for storing, responsive to the indication, status information of the data storage device in the AON memory; means, such as circuit/module 926, for reducing, responsive to the indication and the stored status information, a power usage of the data storage device such that the only component of the data storage device that remains on is the AON memory; and means, such as circuit/module 928, for restoring, responsive to the data storage device resuming the powered-on state, the status information to the data storage device from the AON memory.

In at least some other examples, means may be provided for performing the functions illustrated in FIG. 9 and/or other functions illustrated or described herein. For example, the means may include one or more of: means, such as circuit/module 922, for determining whether the temperature of the data storage device still exceeds the first temperature threshold after a preselected period after the indication; means, such as circuit/module 924, for storing, responsive to the indication and the determining that the temperature of the data storage device still exceeds the temperature threshold after the preselected period, the status information of the data storage device in the AON memory; means, such as circuit/module 926, for operating, responsive to the determining that the temperature of the data storage device does not exceed the temperature threshold for the preselected period, without causing the data storage device to enter the low power state; means, such as circuit/module 920, for receiving a second indication that a temperature of the data storage device exceeds a second temperature threshold that is less than the first temperature threshold, while the data storage device is in the powered-on state; means, such as circuit/module 926, for activating, responsive to the second indication, a thermal throttling and thereby causing the data storage device to enter a power state that consumes less power than the powered-on state; means, such as circuit/module 930, for receiving commands from a host device; and means, such as circuit/module 930, executing commands using the NVM.

Additional Aspects

At least some of the processing circuits described herein may be generally adapted for processing, including the execution of programming code stored on a storage medium. As used herein, the terms "code" or "programming" shall be construed broadly to include without limitation instructions, instruction sets, data, code, code segments, program code, programs, programming, subprograms, software modules, applications, software applications, software packages, routines, subroutines, objects, executables, threads of execution, procedures, functions, etc., whether referred to as software, firmware, middleware, microcode, hardware description language, or otherwise.

At least some of the processing circuits described herein may be arranged to obtain, process and/or send data, control data access and storage, issue commands, and control other desired operations. The processing circuits may include circuitry configured to implement desired programming provided by appropriate media in at least one example. For example, the processing circuits may be implemented as one or more processors, one or more controllers, and/or other structure configured to execute executable programming. Examples of processing circuits may include a general purpose processor, a digital signal processor (DSP), an ASIC, a field programmable gate array (FPGA) or other programmable logic component, discrete gate or transistor logic, discrete hardware components, or any combination thereof designed to perform the functions described herein. A general purpose processor may include a microprocessor, as well as any conventional processor, controller, microcontroller, or state machine. At least some of the processing circuits may also be implemented as a combination of computing components, such as a combination of a controller and a microprocessor, a number of microprocessors, one or more microprocessors in conjunction with an ASIC and a microprocessor, or any other number of varying configurations. The various examples of processing circuits noted herein are for illustration and other suitable configurations within the scope of the disclosure are also contemplated.

Aspects of the subject matter described herein can be implemented in any suitable NVM, including NAND flash memory such as 3D NAND flash memory. More generally, semiconductor memory devices include working memory devices, such as DRAM or SRAM devices, NVM devices, ReRAM, EEPROM, flash memory (which can also be considered a subset of EEPROM), ferroelectric random access memory (FRAM), and MRAM, and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured. The semiconductor memory elements located within and/or over a substrate may be arranged in two or three dimensions, such as a two dimensional memory structure or a three-dimensional memory structure.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements. One of skill in the art will recognize that the subject matter described herein is not limited to the two-dimensional and three-dimensional exemplary structures described but cover all relevant memory structures within the spirit and scope of the subject matter as described herein and as understood by one of skill in the art.

The examples set forth herein are provided to illustrate certain concepts of the disclosure. The apparatus, devices, or components illustrated above may be configured to perform one or more of the methods, features, or steps described herein. Those of ordinary skill in the art will comprehend that these are merely illustrative in nature, and other examples may fall within the scope of the disclosure and the appended claims. Based on the teachings herein those skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

Aspects of the present disclosure have been described above with reference to schematic flowchart diagrams and/or schematic block diagrams of methods, apparatus, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

The subject matter described herein may be implemented in hardware, software, firmware, or any combination thereof. As such, the terms "function," "module," and the like as used herein may refer to hardware, which may also include software and/or firmware components, for implementing the feature being described. In one example implementation, the subject matter described herein may be implemented using a computer readable medium having stored thereon computer executable instructions that when executed by a computer (e.g., a processor) control the computer to perform the functionality described herein. Examples of computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

The various features and processes described above may be used independently of one another, or may be combined in various ways. All possible combinations and sub-combinations are intended to fall within the scope of this disclosure. In addition, certain method, event, state, or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner. Tasks or events may be added to or removed from the disclosed example embodiments. The example systems and components described herein may be configured differently than described. For example, elements may be added to, removed from, or rearranged compared to the disclosed example embodiments.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The word "exemplary" is used herein to mean "serving as an example, instance, or illustration." Any aspect described herein as "exemplary" is not necessarily to be construed as preferred or advantageous over other aspects. Likewise, the term "aspects" does not require that all aspects include the discussed feature, advantage, or mode of operation.

While the above descriptions contain many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents. Moreover, reference throughout this specification to "one embodiment," "an embodiment," "in one aspect," or similar language means that a particular feature, structure, or characteristic described in connection with the embodiment is included in at least one embodiment of the present disclosure. Thus, appearances of the phrases "in one embodiment," "in an embodiment," "in one aspect," and similar language throughout this specification may, but do not necessarily, all refer to the same embodiment, but mean "one or more but not all embodiments" unless expressly specified otherwise.

The terminology used herein is for the purpose of describing particular aspects only and is not intended to be limiting of the aspects. As used herein, the singular forms "a," "an" and "the" are intended to include the plural forms as well (i.e., one or more), unless the context clearly indicates otherwise. An enumerated listing of items does not imply that any or all of the items are mutually exclusive and/or mutually inclusive, unless expressly specified otherwise. It will be further understood that the terms "comprises," "comprising," "includes" "including," "having," and variations thereof when used herein mean "including but not limited to" unless expressly specified otherwise. That is, these terms may specify the presence of stated features, integers, steps, operations, elements, or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "/" between two adjacent words has the same meaning as "or" unless expressly stated otherwise. Moreover, phrases such as "connected to," "coupled to" or "in communication with" are not limited to direct connections unless expressly stated otherwise.

Any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be used there or that the first element must precede the second element in some manner. Also, unless stated otherwise a set of elements may include one or more elements. In addition, terminology of the form "at least one of A, B, or C" or "A, B, C, or any combination thereof" or "one or more of A, B, or C" used in the description or the claims means "A or B or C or any combination of these elements." For example, this terminology may include A, or B, or C, or A and B, or A and C, or A and B and C, or 2A, or 2B, or 2C, or 2A and B, and so on. As a further example, "at least one of: A, B, or C" or "one or more of A, B, or C" is intended to cover A, B, C, A-B, A-C, B-C, and A-B-C, as well as multiples of the same members (e.g., any lists that include AA, BB, or CC). Likewise, "at least one of: A, B, and C" or "one or more of A, B, or C" is intended to cover A, B, C, A-B, A-C, B-C, and A-B-C, as well as multiples of the same members. Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone, C alone, A and B together, A and C together, B and C together, or A, B, and C together.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

What is claimed is:

1. A data storage device, comprising:
   a non-volatile memory (NVM);
   an always-on (AON) memory; and
   a processor coupled to the NVM and the AON memory, the processor configured to:
   receive an indication that a temperature of the data storage device exceeds a first temperature threshold, while the data storage device is in a powered-on state;
   store, responsive to the indication, status information of the data storage device in the AON memory;
   cause, responsive to the indication and the stored status information, the data storage device to enter a low power state wherein the only component of the data storage device that remains on is the AON memory; and
   restore, responsive to the data storage device resuming the powered-on state, the status information to the data storage device from the AON memory,
   wherein the AON memory is configured to operate at a temperature greater than the first temperature threshold.

2. A data storage device, comprising:
   a non-volatile memory (NVM);

an always-on (AON) memory; and
a processor coupled to the NVM and the AON memory, the processor configured to:
receive an indication that a temperature of the data storage device exceeds a first temperature threshold, while the data storage device is in a powered-on state;
determine whether the temperature of the data storage device exceeds the temperature threshold after a preselected period after the indication;
store, responsive to the indication and the determination that the temperature of the data storage device still exceeds the temperature threshold after the preselected period, the status information of the data storage device in the AON memory;
cause, responsive to the indication and the stored status information, the data storage device to enter a low power state wherein the only component of the data storage device that remains on is the AON memory; and
restore, responsive to the data storage device resuming the powered-on state, the status information to the data storage device from the AON memory.

3. The data storage device of claim 2, wherein the processor is further configured to:
operate, responsive to the determination that the temperature of the data storage device does not exceed the temperature threshold for the preselected period, without causing the data storage device to enter the low power state.

4. The data storage device of claim 2, wherein the preselected period is in a range from about 2 seconds to about 3 seconds.

5. The data storage device of claim 1, wherein the status information comprises at least one of boot block information, directory information, or context information for the processor.

6. The data storage device of claim 1, wherein the processor is further configured to:
receive a second indication that a temperature of the data storage device exceeds a second temperature threshold that is less than the first temperature threshold, while the data storage device is in the powered-on state; and
activate, responsive to the second indication, a thermal throttling and thereby cause the data storage device to enter a power state that consumes less power than the powered-on state.

7. The data storage device of claim 1, wherein the first temperature threshold corresponds to a maximum allowed temperature before a data loss occurs in the NVM based on temperature.

8. The data storage device of claim 1, further comprising:
a temperature sensor configured to report the temperature of the data storage device and positioned proximate the NVM.

9. The data storage device of claim 1, wherein the processor is further configured to:
receive commands from a host device; and
execute the commands using the NVM.

10. A method for use with a data storage device including a non-volatile memory (NVM) and an always-on (AON) memory, the method comprising:
receiving an indication that a temperature of the data storage device exceeds a first temperature threshold, while the data storage device is in a powered-on state;
storing, responsive to the indication, status information of the data storage device in the AON memory;
reducing, responsive to the indication and the stored status information, a power usage of the data storage device to a low power state such that the only component of the data storage device that remains on is the AON memory; and
restoring, responsive to the data storage device resuming the powered-on state, the status information to the data storage device from the AON memory,
wherein the AON memory is configured to operate at a temperature greater than the first temperature threshold.

11. A method for use with a data storage device including a non-volatile memory (NVM) and an always-on (AON) memory, the method comprising:
receiving an indication that a temperature of the data storage device exceeds a first temperature threshold, while the data storage device is in a powered-on state;
determining whether the temperature of the data storage device still exceeds the first temperature threshold after a preselected period after the indication;
storing, responsive to the indication and the determining that the temperature of the data storage device still exceeds the temperature threshold after the preselected period, the status information of the data storage device in the AON memory;
reducing, responsive to the indication and the stored status information, a power usage of the data storage device to a low power state such that the only component of the data storage device that remains on is the AON memory; and
restoring, responsive to the data storage device resuming the powered-on state, the status information to the data storage device from the AON memory.

12. The method of claim 11, further comprising:
operating, responsive to the determining that the temperature of the data storage device does not exceed the temperature threshold for the preselected period, without causing the data storage device to enter the low power state.

13. The method of claim 10, wherein the status information comprises at least one of boot block information, directory information, or context information for a processor of the data storage device.

14. The method of claim 10, further comprising:
receiving a second indication that a temperature of the data storage device exceeds a second temperature threshold that is less than the first temperature threshold, while the data storage device is in the powered-on state; and
activating, responsive to the second indication, a thermal throttling and thereby causing the data storage device to enter a power state that consumes less power than the powered-on state.

15. The method of claim 10, wherein the first temperature threshold corresponds to a maximum allowed temperature before a data loss occurs in the NVM based on temperature.

16. The method of claim 10, further comprising:
sensing a temperature at the NVM; and
generating the indication of the temperature of the data storage device using the sensed NVM temperature.

17. The method of claim 10, further comprising:
receiving commands from a host device; and
executing the commands using the NVM.

18. A data storage device, comprising:
a non-volatile memory (NVM);
an always-on (AON) memory;

means for receiving an indication that a temperature of the data storage device exceeds a temperature threshold, while the data storage device is in a powered-on state;

means for storing, responsive to the indication, status information of the data storage device in the AON memory;

means for reducing, responsive to the indication and the stored status information, a power usage of the data storage device such that the only component of the data storage device that remains on is the AON memory; and means for restoring, responsive to the data storage device resuming the powered-on state, the status information to the data storage device from the AON memory, wherein the AON memory is configured to operate at a temperature greater than the first temperature threshold.

19. A data storage device, comprising:

a non-volatile memory (NVM);

an always-on (AON) memory; and a processor coupled to the NVM and the AON memory, the processor configured to:

receive an indication that a temperature of the data storage device exceeds a first temperature threshold, while the data storage device is in a powered-on state;

store, responsive to the indication, status information of the data storage device in the AON memory;

cause, responsive to the indication and the stored status information, the data storage device to enter a low power state; and restore, responsive to the data storage device resuming the powered-on state, the status information to the data storage device from the AON memory, wherein the AON memory is configured to operate at a temperature greater than the first temperature threshold.

\* \* \* \* \*